(12) United States Patent
Pollack

(10) Patent No.: US 8,909,606 B2
(45) Date of Patent: Dec. 9, 2014

(54) DATA BLOCK COMPRESSION USING COALESCION

(75) Inventor: Joshua Pollack, San Francisco, CA (US)

(73) Assignee: Google Inc., Mountain View, CA (US)

(*) Notice: Subject to any disclaimer, the term of this patent is extended or adjusted under 35 U.S.C. 154(b) by 984 days.

(21) Appl. No.: 12/136,643

(22) Filed: Jun. 10, 2008

(65) Prior Publication Data

US 2009/0307247 A1 Dec. 10, 2009

(51) Int. Cl.
*G06F 17/00* (2006.01)
*G06F 17/30* (2006.01)
*G06F 7/00* (2006.01)
*H03M 7/30* (2006.01)

(52) U.S. Cl.
CPC .................................. *H03M 7/3088* (2013.01)
USPC .......................................... 707/682; 707/899

(58) Field of Classification Search
CPC ................... G06F 17/30032; G06F 17/30038; G06F 17/30058
See application file for complete search history.

(56) References Cited

U.S. PATENT DOCUMENTS

| | | | |
|---|---|---|---|
| 6,360,220 B1 * | 3/2002 | Forin ................................... 1/1 |
| 6,912,645 B2 * | 6/2005 | Dorward et al. .............. 711/216 |
| 7,478,113 B1 * | 1/2009 | De Spiegeleer et al. .............. 1/1 |
| 7,636,767 B2 * | 12/2009 | Lev-Ran et al. ............... 709/218 |
| 2002/0150791 A1 * | 10/2002 | Yuasa et al. .................... 428/692 |
| 2004/0128618 A1 * | 7/2004 | Datta ............................. 715/513 |
| 2004/0153458 A1 * | 8/2004 | Noble et al. ..................... 707/10 |
| 2007/0103984 A1 * | 5/2007 | Kavuri et al. ............. 365/185.17 |

OTHER PUBLICATIONS

Hong et al.; Duplicate Data Elimination in a SAN File System; p. 101-114.

* cited by examiner

*Primary Examiner* — Susan Chen
(74) *Attorney, Agent, or Firm* — Morris & Kamlay LLP

(57) ABSTRACT

A method for processing blocks of data in a file is provided. The method includes determining a plurality of blocks of data in the file for a compression process used for compressing data in the file. This process is iterated over all the plurality of blocks of data in the file. A block of data is read into memory, and the offset from which it is read is also stored. A strong collision-resistant cryptographic hash representation, such as a strong collision-resistant cryptographic hash, of the block is determined. The cryptographic hash representation (CHR) of the block of data as well as the data itself, is added to a table with the CHR as a unique index. The offset of the block of data in the source file, as well as the CHR for that block are appended to a separate table.

19 Claims, 4 Drawing Sheets

DATA BLOCK COMPRESSION USING COALESCION

BACKGROUND

Particular embodiments generally relate to file compression.

When compressing large amounts of data, a window of a certain size may be used to review data found in the window. For example, the window may take a block of a certain size of data and analyze that data for redundancies. The window may be moved from along the data and continually analyzed for possible compression. The reason for using the window is that it speeds up the compression process by looking at smaller amounts of data in the window rather than having to search the whole file of data for redundancies. Although speed may be gained, the amount of compression may not be as great as desired or the data may not be compressed as efficiently as possible. Also, when compressing streaming data, a small window of data can only be reviewed at once as the data is streamed.

SUMMARY

A method for processing blocks of data in a file is provided. The method includes determining a plurality of blocks of data in the file for a compression process used for compressing data in the file. A compression process may be performed that includes the following steps. This process is iterated over all the plurality of blocks of data in the file. A block of data is read into memory, and the offset from which it is read is also stored. A strong collision-resistant cryptographic hash representation, such as a strong collision-resistant cryptographic hash, of the block is determined. The cryptographic hash representation (CHR) of the block of data as well as the data itself, is added to a table (Table A) with the CHR as a unique index. The fact that the CHR is a unique index means that there can be no two entries in Table A with the same CHR. The offset of the block of data in the source file, as well as the CHR for that block are appended to a separate table (Table B). This process is performed to compress the file.

The file may be decompressed at another time. Iterating through all entries in Table B, the CHR for the entry is used as an index into Table A. The block of data associated with the CHR is read from Table A and written to the output device, at the offset specified in the first half of the entry. This process continues until the file is decompressed.

In another embodiment, a method for processing blocks of data in a file is provided. The method includes determining a plurality of blocks of data in the file for a compression process used for compressing data in the file. A compression process may be performed that includes the following steps. This process is iterated over all the plurality of blocks of data in the file. A block of data is read into memory, and the offset from which it is read is also stored. A strong collision-resistant cryptographic hash representation, such as a strong collision-resistant cryptographic hash, of the block is determined. The cryptographic hash representation (CHR) of the block of data as well as a compressed version of the data itself is added to a table (Table A) with the CHR as a unique index. The fact that the CHR is a unique index means that there can be no two entries in Table A with the same CHR. The offset of the block of data in the source file, as well as the CHR for that block are appended to a separate table (Table B). This process is performed to compress the file.

The file may be decompressed at another time. Iterating through all entries in Table B, the CHR for the entry is used as an index into Table A. The block of data associated with the CHR is read from Table A, decompressed, and written to the output device, at the offset specified in the first half of the entry. This process continues until the file is decompressed.

A further understanding of the nature and the advantages of particular embodiments disclosed herein may be realized by reference of the remaining portions of the specification and the attached drawings.

DETAILED DESCRIPTION OF EMBODIMENTS

Figure 1:
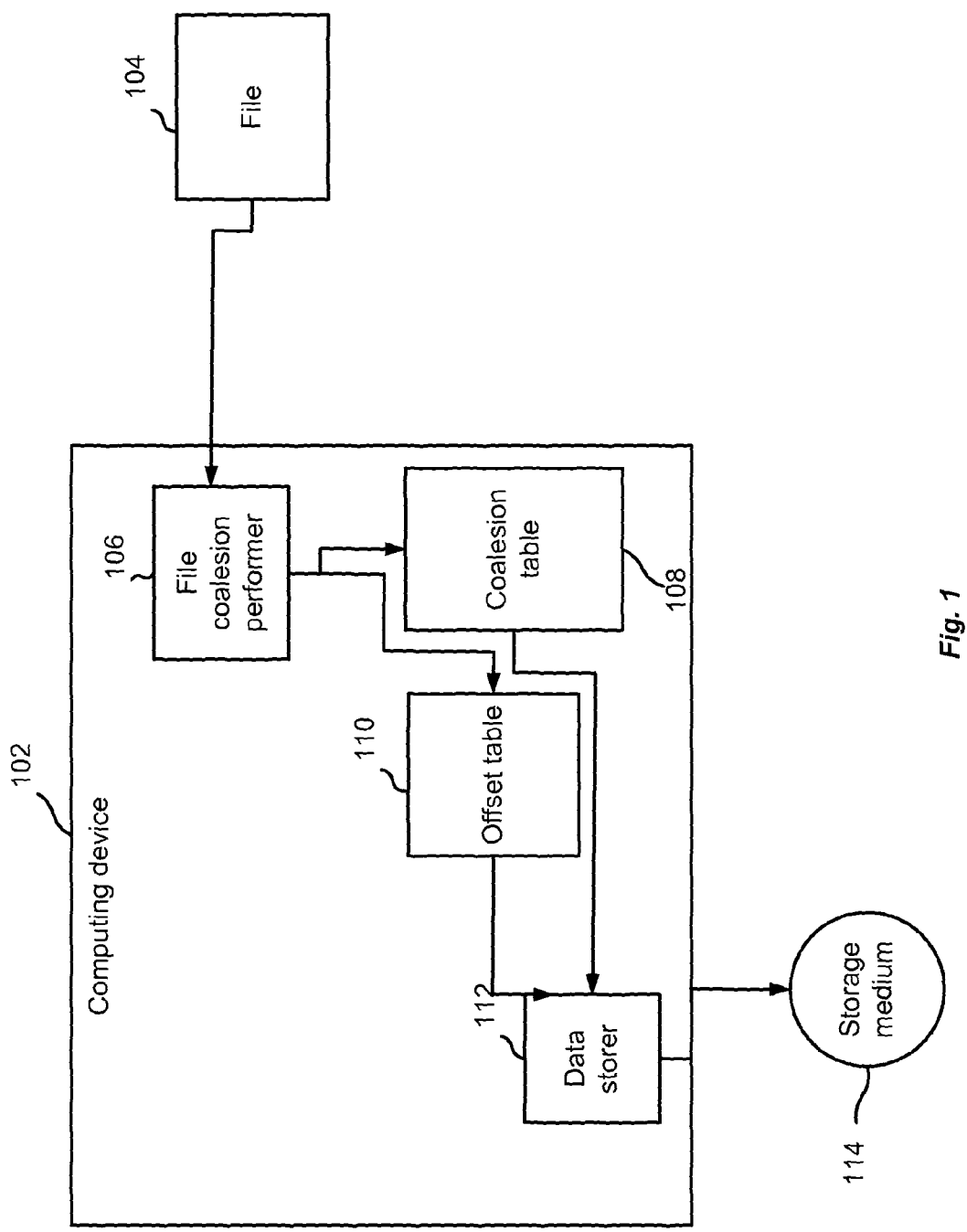
FIG. 1 depicts an example of a system for performing block coalescion file compression according to one embodiment.

FIG. 1 depicts an example of a system 100 for performing block coalescion file compression according to one embodiment. System 100 includes a computing device 102. Although one computing device 102 is described, it will be understood that computing device 102 may include multiple computing devices where functions are distributed among them.

Computing device 102 receives data from a file 104. File 104 may be any kind of data that is provided in the file. The data may be an image of a storage device, such as a hard drive, file system, or other storage devices that can store data. The image may be a snapshot of data that is stored on the medium at a point in time.

Computing device 102 includes a file coalescion performer 106 that is configured to coalesce blocks of data from hard drive 104. File coalescion performer 106 receives a plurality of blocks of data from file 104 and performs a coalescion process to compress the data. The coalescion process coalesces blocks of data by not storing each block of data when redundant blocks are encountered. Instead, offsets to the blocks are stored. The data that is stored may also be compressed.

File coalescion performer 106 performs the coalescion process by iterating over the plurality of blocks of data in the file. A block of data is read into memory and an offset from which it is read is also determined. A cryptographic hash representation, such as a strong collision-resisting cryptographic hash representation, of the block is determined. The cryptographic hash representation of the block of data as well as the data itself is added to a coalescion table 108. The cryptographic hash representation is used as a unique index in coalescion table 108. Because the cryptographic hash representation is a unique index, then there cannot be two entries in coalescion table 108 for the same cryptographic hash representation. If multiple blocks have the same cryptographic hash representation, then the offset of the block of data in file 104 is stored in an offset table 110. The data for the duplicate block is not stored in coalescion table 108. This achieves compression.

A data storer 112 is configured to store coalescion table 108 and offset table 110 on a storage medium 114. Data storer 112 may compress the data using any compression methods.

Thus, coalescion is performed to determine redundant blocks of data and also the single instance of data that is stored may be compressed.

In creating a restore medium that can be used to recreate an image of file 104, the data in file 104 may be larger than storage medium 114. For example, a restore disk for an image of a computer hard drive may be created as storage medium 114. However, the image of the hard drive may be larger than what can be stored on storage medium 114. Accordingly, the file coalescion method is used to coalesce the data and store it on storage medium 114.

Storage medium 114 may be a digital versatile disk (DVD). The DVD may be used to restore the entire contents of a hard drive. Thus, a user may insert the DVD into a computer and restore the contents of a hard drive that was compressed onto the DVD. Because of the coalescion, the entire contents of the hard drive may be stored on the DVD in an efficient manner.

Figure 2:
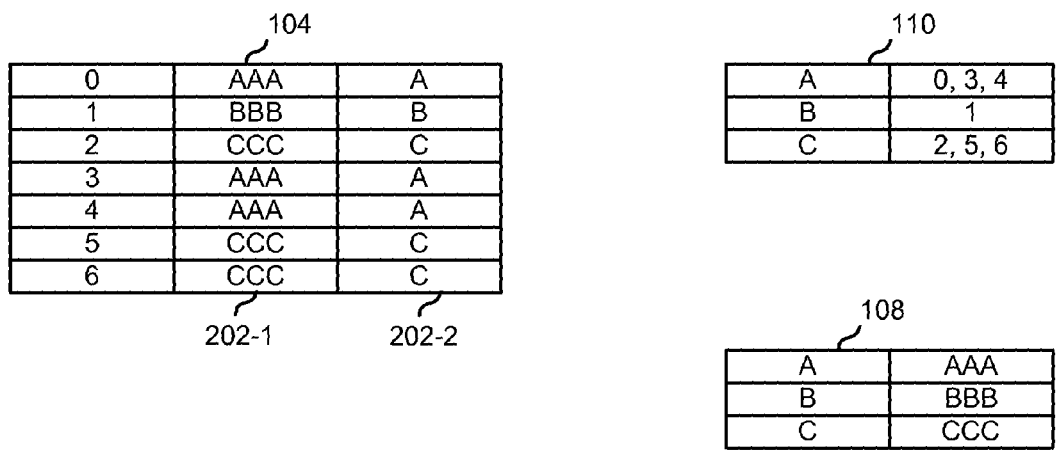
FIG. 2 depicts an example of tables according to one embodiment.

The compression process with respect to how data is stored in tables 108 and 110 will be described in more detail. FIG. 2 depicts an example of tables 108 and 110 according to one embodiment.

File 104 shows blocks of data. For the file, it may be 24576 bytes long, and a block length of 4096 bytes. The size of chunks may be determined to allow the largest possible chunks. Having larger chunks may mean that the index is smaller. That is, fewer hash values need to be stored in table 108 and fewer offsets need to be stored in table 110. The chunk size that may be determined may be based on alignment in the file. For example, file systems have cluster sizes of 4096 bytes. Thus, choosing block sizes of this size allows data to be written to file 406 efficiently during decompression. That is, alignment issues are avoided because blocks can be written in the 4096 block size. A block size determination may be determined by querying a file system to determine the standard file system chunking size (i.e., the cluster size of the blocks).

File 104 has blocks that are listed as 0, 1, 2, 3, 4, . . . N. As shown, each block includes data. The data is represented as letters, such as "AAA", "BBB", "CCC", etc. It will be understood that this represents any kind of data but the same combination of letters means that the block contains the same data. A cryptographic hash of the blocks of data is computed and shown in 202-2. The cryptographic hash is a transformation that takes an input of a block of data and returns a fixed-size string, which is called the hash value. The hash value is a concise representation of the block of data from which it was computed. The cryptographic hash function that is used to generate the hash value may be an MD5 function. Also, as is known, the same data is hashed to the same hash value. Thus, AAA is hashed to A, BBB is hashed to B, and CCC is hashed to C. The function may be a strong collision resistant hash function, which means that the likelihood of two different blocks of data hashing to the same hash value (i.e., a collision) is very small or almost impossible. This is important because the coalescion process saves the offset of block if the hash value has already been generated from a previously block of data. To accurately recreate the image of a hard drive, the instance of two different blocks of data hashing to the same hash value is minimized.

For a block 0, the hash value of A is compared to a list of known hashes in table 110. For example, the first time that the hash value of A is computed, it is not in table 110. Accordingly, A is stored in table 108 and the data for block 0 is stored. Thus, the hash values used as an index in table 108 and the data for the hash value is the data for the block. As shown in table 108, the hash value of A corresponds to the data of AAA.

When the hash value and data is added to table 108, an offset is added to offset table 110. The offset indicates where in the file the block of data is found. In this case, block 0 is added to table 110 with the key to the index of the hash value of A.

For block 1, the computed hash value is B. This value is not in table 108 and it is added. Also the offset is added to offset table 110 for the hash value of B. The same is true for block 2 where the value of C is not included in table 108 and the offset is added to table 110 for the hash value of C.

For block 3, the computed hash value is A and when it is looked up in table 108, the index A is already included. Because the hash value is of a smaller size than the data of the block, the lookup in table 108 is faster. It can be determined whether or not the block of data has been encountered before in file 104. In this case, this block of data corresponds to the hash value of A that has already been computed and thus it is known that the block of data has already been encountered. Accordingly, data does not need to be stored in table 108 again. Rather, an offset to the block of data is added to offset table 110. In this case, the offset of block 3 is added to table 110 for the hash value of A. The same is true for block 4, which contains the same data as blocks 0 and 3.

Blocks 5 and 6 correspond to the computed hash value of C, which has already been added to table 108. Accordingly, the data is not added to table 108 again, but the offsets of 5 and 6 are added to offset table 110. This process continues as all data blocks in file 104 are processed.

Although one file is described as being coalesced, it will be understood that multiple files may be coalesced together. The offsets for each file may be recorded and the data may be stored in a master coalescion table 108. For example, separate tables for each file record the offsets and the data is stored in coalescion table 108.

Figure 3:
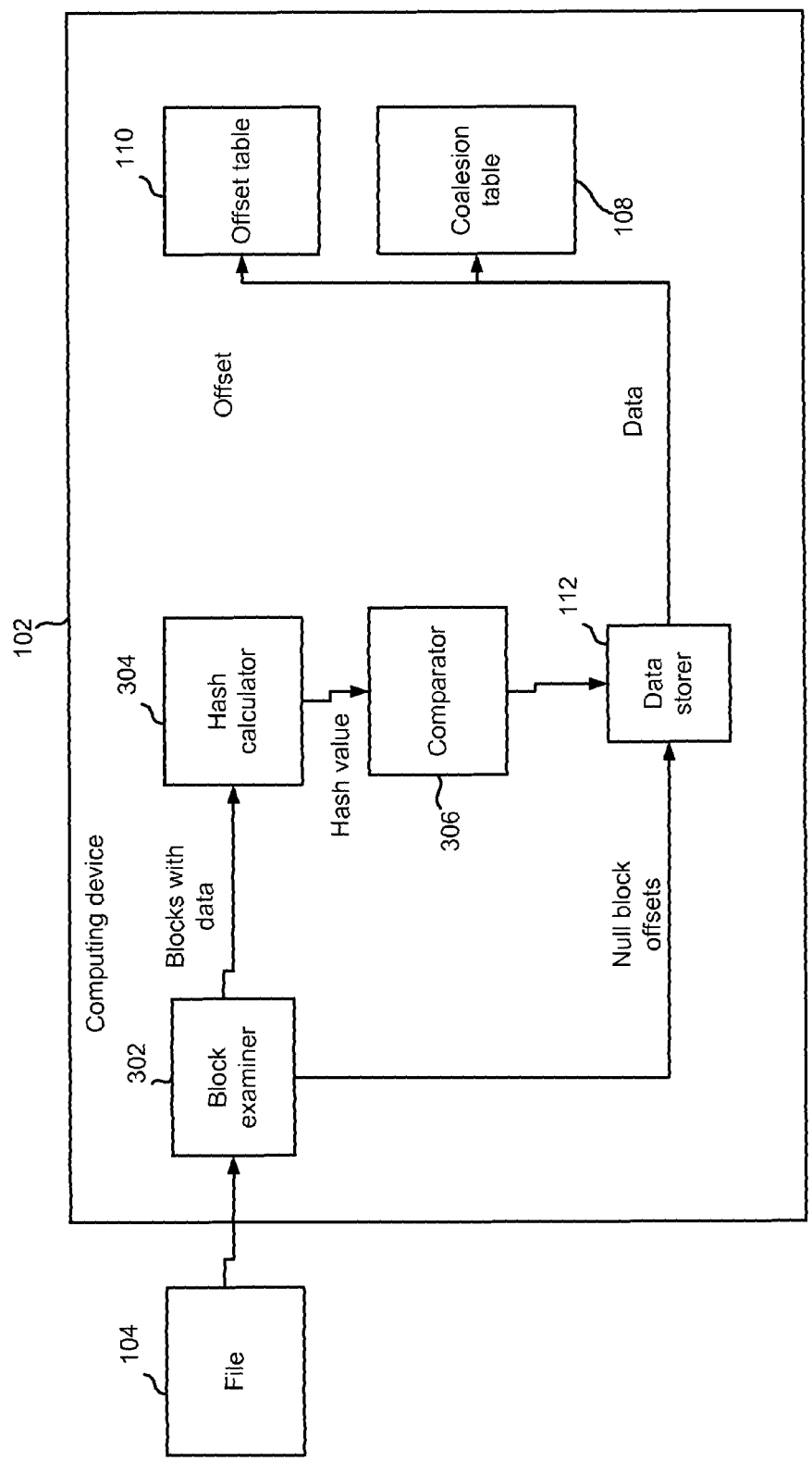
FIG. 3 depicts a more detailed example of computing device according to one embodiment.

FIG. 3 depicts a more detailed example of computing device 102 according to one embodiment. File data is received at a block examiner 302. Block examiner 302 is configured to analyze the data in the file to determine blocks that actually contain data. In some cases, such as in the case of sparse files, a file can be larger and composed of far fewer blocks that contain data. For example, there may be large spaces in the file that do not contain data. Accordingly, determining which blocks actually contain data increases efficiency in the processing of the data. For example, the data is read out of the file and searched for blocks of data that do not contain data. In one example, given an image of a hard drive, represented as a 60 gb sparse file, but containing only 4 gb of actual data, time is saved by only adding 4 gb of data containing blocks instead of all 60 gb which contain many blocks containing nulls. By removing the 54 gb that contain nulls, the processing of 4 gb is much more efficient. Accordingly, a first pass through the entire data in the file is performed.

Blocks with data are sent to hash calculator 304. Hash calculator 304 calculates the cryptographic hash representation. Although a cryptographic hash representation is described, it will be understood that other calculations may be performed, such as any calculations that can determine relatively unique values from data may be used.

A comparator 306 receives the hash value and compares it to values found in table 108. If the value is found in table 108, data storer 112 adds an offset to offset table 110. If not, a data storer 112 adds the hash value as an index and the data to table 108 and adds an offset to offset table 110. Also, data storer 112 may add an entry for a null block with offsets. For example, the index value may be associated with a null entry and the indication that the block should contain null data is stored in table 108. Also, the offsets for the null blocks are stored in offset table 110. The above process continues until all blocks have been processed.

Accordingly, two passes over the data in file 104 are performed. The second pass is performed and takes into account all data previously processed. For example, by doing a hash table look up with the generated hash value, all hash values for previous blocks of data are taken into account as to whether they have been encountered before. However, if a window of a small amount of data is used, the data of all previously processed data in file 104 would not be taken into account. Thus, a block of data encountered when a window that is moving may be the same as a block of data encountered previously. Particular embodiments compress data without a window and thus can achieve good compression. Using the hash table look up is also an efficient way to determine if the block of data has been encountered before. The entire data set may be reviewed because the data is not streaming and can be accessed (i.e., data that can be coalesced is not missing or being received in the future).

Because duplication of data does not need to be stored in table 108, the data for blocks stored in table 108 does not need to be kept in random access memory (RAM). This is because a window is not being used where data currently being processed may need to be compared to other data in the window. The hash value is sufficient to determine whether the data has been encountered before. Thus, the hash values for table 108 are kept in memory, but the data being stored may be written to storage medium 114. The hash values do not take up a lot of memory and thus a large majority of the RAM of computing device 100 is available for the coalescion process. This also speeds up processing of file 104.

Figure 4:
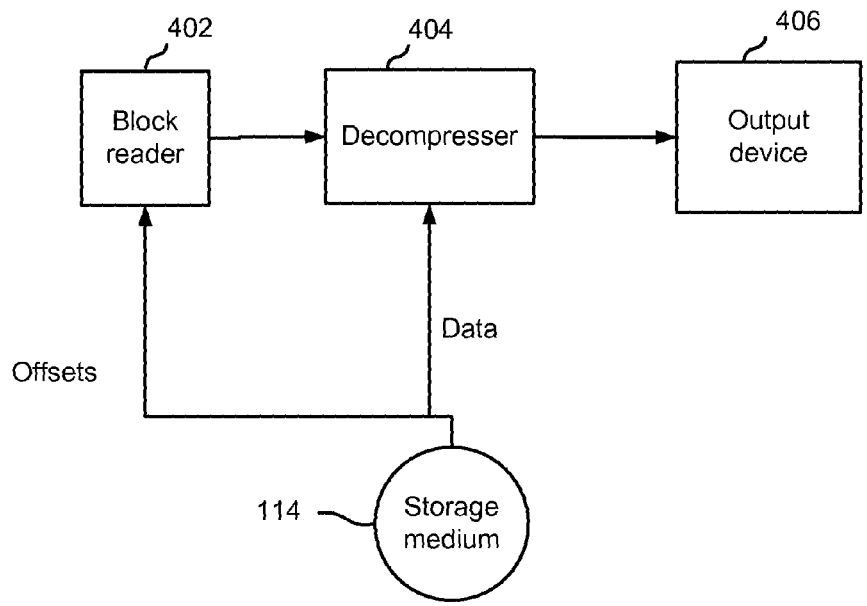
FIG. 4 depicts an example of decompressing the data on a storage medium according to one embodiment.

When the coalescion process is finished, tables 108 and 110 are written to storage medium 114. Storage medium 114 may then be used to recreate file 104. FIG. 4 depicts an example of decompressing the data on storage medium 114 according to one embodiment. Storage medium 114 is received at computing device 102. It should be noted that computing device 102 may be a different computing device than that used to generate storage medium 114. For example, storage medium 114 may be generated and provided to a user. The user may then use storage medium 114 to restore an image onto their hard drive of their own computer.

A block reader 402 is configured to read the offsets in offset table 110. For example, for hash value A, the offset of 0 is determined. A decompressor 404 then reads the data for the hash value of A from table 108. The data stored in table 108 may be decompressed. This data is then stored in the offset in output device 406. This process continues as the offsets and offset table are iterated through. For example, all blocks that have hash values of A may be processed first. In this case, the offsets of 0, 3, and 4 may be processed by decompressor 404 at once. Once the data of AAA is decompressed, it may be stored at offsets 0, 3, and 4 in output device 406. Output device 406 may be any destination for the data. For example, output device 406 may be a hard drive, file, file system, etc. Also, this process alleviates the problem of storing the decompressed data in random access memory (RAM). For example, if decompressor 404 had to wait until the offset of 3 was encountered (i.e., the offset of 1 and 2 need to be processed first), then the decompressed data of AAA needs to be kept in RAM. As the processing is performed, this may use up valuable memory space in RAM. Also, if the block data AAA is discarded instead of being kept in RAM, then a second decompression step needs to be performed when the block of A is encountered again. Thus, the blocks of data may be processed with all the offsets at once.

After the processing of hash value of A, the hash value of B is processed. Accordingly, the offsets and data for the hash value of B is retrieved from tables 108 and 110, decompressed, and stored in the offsets in output device 406. The above process is continued until all blocks of data found in file 104 are written to output device 406.

In a particular embodiment, file 104 may be a Ghost™ file that is generated from data. This may be a large sparse file that can be generated from the image of a hard drive. A loop back device may be associated with a Ghost™ file. The loop back device may be a virtual device that is associated with the Ghost™ file. The Ghost™ file is queried to determine which blocks contain data. A list of offsets is returned of blocks that contain data. The hash is computed off these blocks, and the above process is performed to determine the data to be stored in tables 108 and 110.

Accordingly, a restore medium may be created that can be used to recreate an image. In one example, a computing device manufacturer may have a hard disk image that is provided on the initial installation of a computing device. For example, a portable computing device may have a hard drive image that is created. At some point, users may want to restore this image of the hard drive to their computer. For example, the hard drive may become corrupted and a solution is to restore the computer back to its original image when it left the manufacturer. Medium 114 can thus be used to restore the image of the hard drive. Because the size of the hard drive is greater than what can be stored on storage medium 114, the image is compressed onto storage medium 114.

Figure 5:
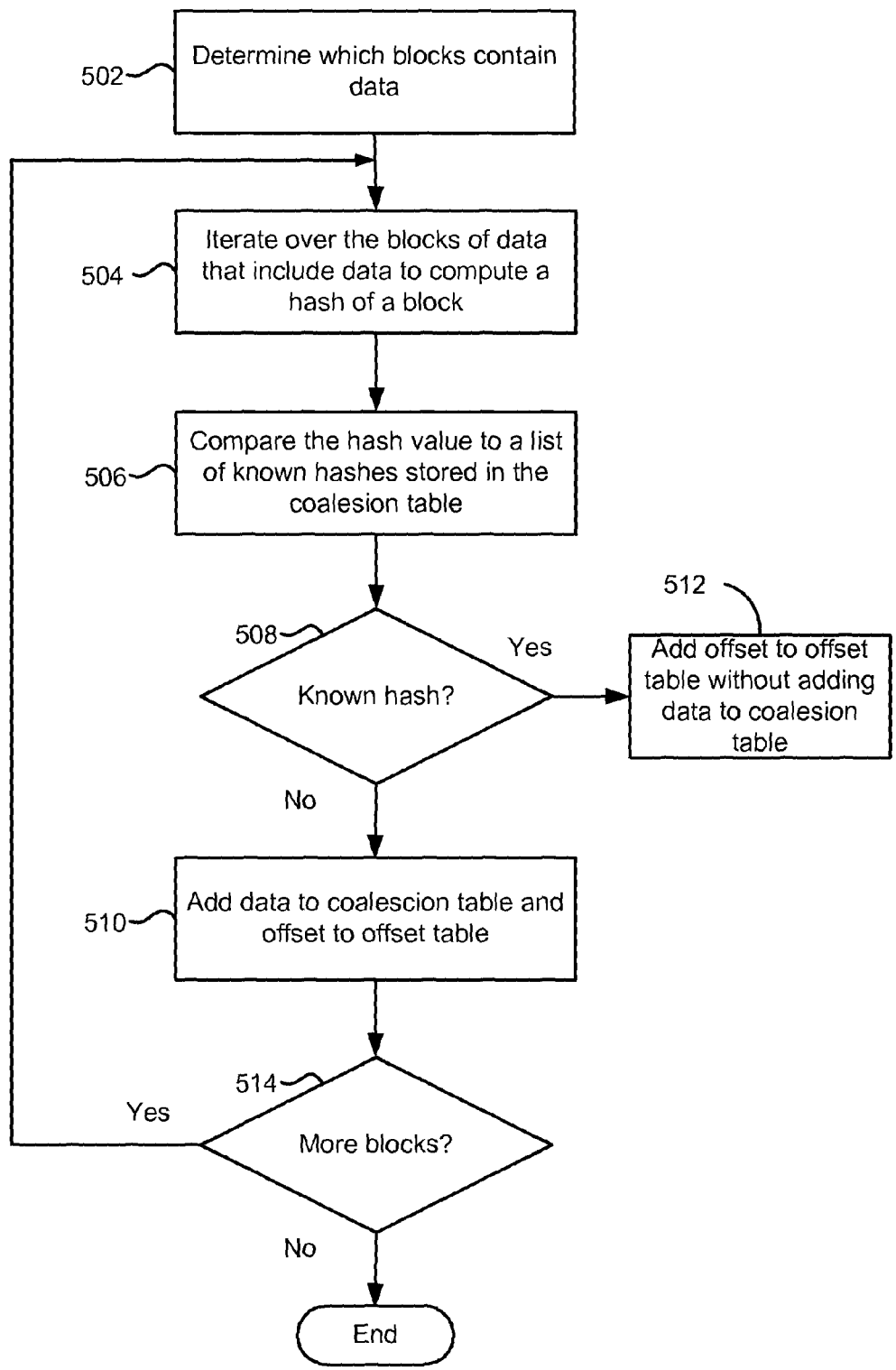
FIG. 5 depicts a simplified flow chart of a method for coalescing a file.

FIG. 5 depicts a simplified flow chart of a method for coalescing a file 104. Step 502 determines which blocks contain data. Blocks of data that contain no data are thus removed from the processing.

Step 504 iterates over the blocks of data that include data to compute a hash of a block. Step 506 compares the hash value to a list of known hashes stored in table 110.

Step 508 determines if the list of known hashes does not contain a computed hash. If the list of known hashes does not contain the computed hash, the block is new and step 510 adds the data to table 108. Also, the offset is added to table 110. If the list of known hashes does contain the computed hash, the data is not added to table 108, but step 512 adds the offset to offset table 110. The process then reiterates to step 506 where another block is determined. Step 514 determines if more blocks that include data need to be processed from file 104. If so, the process reiterates. If not, the process ends.

Although the description has been described with respect to particular embodiments thereof, these particular embodiments are merely illustrative, and not restrictive. Although coalescing a file and restoring an image of a hard drive are described, it will be understood that particular embodiments may be used with coalescing other data.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

I claim:

1. A computer-implemented method for processing data in a file, the method comprising:
    adding blocks of data from the file to a coalescion table, each block of data associated with a cryptographic hash of the block of data and determined not to have the same cryptographic hash as any other block of data stored in the coalescion table;
    adding a list of identifiers for each cryptographic hash to an offset table, wherein the list includes one or more identifiers for blocks of data that are determined to have the same cryptographic hash; and
    storing the coalescion table and the offset table on a computer readable storage medium that allows restoring of an image of the file on a computing device.

2. The computer-implemented method of claim 1, further comprising:
    for one or more blocks of data in the file that are determined to be null blocks, adding identifiers for the one or more blocks in a list of blocks having a null representation in the offset table.

3. The computer-implemented method of claim 1, further comprising:
    reading a list of identifiers for a cryptographic hash in the offset table from the computer readable storage medium;
    determining a block of data from the coalescion table associated with the cryptographic hash from the computer readable storage medium; and
    storing the block of data to an output device at offsets indicated by the list of identifiers.

4. The computer-implemented method of claim 1, wherein cryptographic hashes in the offset table are used as keys to associated list of identifiers.

5. The computer-implemented method of claim 1, wherein the blocks of data are stored to a computer readable storage medium upon determining the representation is not found in the block table memory.

6. The computer-implemented method of claim 5, wherein the offset table is kept in random access memory of a computing device while the data from the file is processed and stored in the computer readable storage medium after processing of the data is finished.

7. The computer-implemented method of claim 1, further comprising compressing the blocks of data before storing the blocks of data in the coalescion table.

8. The computer-implemented method of claim 1, wherein the image is of a hard drive for the computing device.

9. The computer-implemented method of claim 1, wherein the list of identifiers comprises offset values that indicate an offset in the file where each data block is located.

10. A computer-implemented method comprising:
    generating a first hash of a first block of data in a file;
    determining that the first hash is not stored in a coalescion table, the coalescion table being stored in a computer readable storage medium;
    responsive to determining that the first hash is not stored in the coalescion table, storing the data found in the block of data in the coalescion table on a computer readable storage medium;
    storing a first offset of the first block of data in an offset table, the first offset identifying the location of the first block of data in the file;
    generating a second hash of a second block of data in the file;
    determining that the second hash is found in the coalescion table;
    storing a second offset for the second block of data in the offset table, the second offset identifying the location of the second block of data in the file; and
    associating the second offset with the first hash,
    wherein the coalescion table on the computer readable storage medium allows restoring of an image of the file on the computing device.

11. The computer-implemented method of claim 10, further comprising processing each other block of data in the file and storing either (i) a representation of the block of data in the coalescion table or (ii) an offset of the block of data in the offset table associated with a representation of the block of data, until all non-redundant blocks of data in the file have been so processed.

12. The computer-implemented method of claim 10, further comprising compressing the data for the blocks of data before storing the blocks of data in the coalescion table.

13. The computer-implemented method of claim 10, wherein a plurality of offsets are associated with a hash stored in the coalescion table if a plurality of blocks of data include a same hash, wherein the block of data is not stored in the coalescion table again.

14. The computer-implemented method of claim 10, further comprising:
    reading a list of identifiers for a representation in the offset table from the computer readable storage medium;
    determining a block of data from the coalescion table associated with the representation from the computer readable storage medium; and storing the block of data to an output device at offsets indicated by the list of identifiers.

15. The computer-implemented method of claim 10, wherein the image is of a hard drive for the computing device.

16. The computer-implemented method of claim 10, wherein the blocks of data are stored to a computer readable storage medium upon determining the representation is not found in the block table memory.

17. The computer-implemented method of claim 16, wherein the offset table is kept in random access memory of a computing device during the compression process and stored in the computer readable storage medium after the compression process is finished.

18. A non-transitory computer readable storage medium storing a plurality of instructions that cause a processor to perform a method of processing data in a file, the method comprising:
   adding blocks of data from the file to a coalescion table, each block of data associated with a cryptographic hash of the block of data and determined not to have the same cryptographic hash as any other block of data stored in the coalescion table;
   adding a list of identifiers for each cryptographic hash to an offset table, wherein the list includes one or more identifiers for blocks of data that are determined to have the same cryptographic hash; and
   storing the coalescion table and the offset table on a computer readable storage medium that allows restoring of an image of the file on a computing device.

19. A non-transitory computer readable storage medium storing a plurality of instructions that cause a processor to perform a method comprising:
   generating a first hash of a first block of data in the file;
   determining that the first hash is not stored in a coalescion table stored in a computer readable storage medium;
   responsive to determining that the first hash is not stored in the coalescion table, storing the data found in the block of data in the coalescion table on a computer readable storage medium;
   storing a first offset of the first block of data in an offset table, the first offset identifying the location of the first block of data in the file;
   generating a second hash of a second block of data in the file;
   determining that the second hash is found in the coalescion table;
   storing a second offset for the second block of data in the offset table, the second offset identifying the location of the second block of data in the file; and
   associating the second offset with the first hash,
   wherein the coalescion table on the computer readable storage medium allows restoring of an image of the file on the computing device.

* * * * *